United States Patent
Takahashi et al.

(10) Patent No.: US 7,135,808 B2
(45) Date of Patent: Nov. 14, 2006

(54) LEAD TERMINAL, RESONATOR AND TRAIN OF ELECTRONIC COMPONENTS

(75) Inventors: Tohru Takahashi, Tokyo (JP); Katsuyuki Takei, Tokyo (JP)

(73) Assignee: TDK Corporation, Tokyo (JP)

( * ) Notice: Subject to any disclaimer, the term of this patent is extended or adjusted under 35 U.S.C. 154(b) by 192 days.

(21) Appl. No.: 10/876,691

(22) Filed: Jun. 28, 2004

(65) Prior Publication Data

US 2005/0140250 A1    Jun. 30, 2005

(30) Foreign Application Priority Data

Dec. 25, 2003  (JP) .............................. 2003-431462

(51) Int. Cl.
  *H03H 9/17* (2006.01)
  *H03H 9/13* (2006.01)
(52) U.S. Cl. ...................... 310/320; 310/348; 439/856; 439/862
(58) Field of Classification Search ................ 310/320, 310/348; 439/856, 862, 621–622
See application file for complete search history.

(56) References Cited

U.S. PATENT DOCUMENTS

| | | | |
|---|---|---|---|
| 4,511,202 A * | 4/1985 | Kasai | 333/189 |
| 5,091,671 A * | 2/1992 | Yoshida | 310/358 |
| 5,596,244 A * | 1/1997 | Kugou et al. | 310/348 |
| 5,839,178 A * | 11/1998 | Yoshida et al. | 29/25.35 |
| 6,087,763 A * | 7/2000 | Kim et al. | 310/348 |
| 6,204,593 B1 * | 3/2001 | Takahashi et al. | 310/353 |
| 6,568,053 B1 * | 5/2003 | Sung et al. | 29/25.35 |
| 2001/0009343 A1 * | 7/2001 | Sawai et al. | 310/320 |

FOREIGN PATENT DOCUMENTS

| | | |
|---|---|---|
| JP | 64-42617 | 3/1989 |
| JP | 2-43016 | 3/1990 |
| JP | 4-31823 | 3/1992 |
| JP | 6-58620 | 8/1994 |
| JP | 2002-13637 | 1/2002 |

\* cited by examiner

*Primary Examiner*—Darren Schuberg
*Assistant Examiner*—J. Aguirrechea
(74) *Attorney, Agent, or Firm*—Oblon, Spivak, McClelland, Maier & Neustadt, P.C.

(57) ABSTRACT

A lead portion 10 is made of a rod-like metal conductor and has a step portion 13 at its end portion. A first side plate 11 and a second side plate 12 are formed by using thinned portions of the end portion of the lead portion 10. The first and second side plates 11 and 12 face each other with a distance. One end of the first side plate 11 and one end of the second side plate 12 are continued to each other while the other end of the first side plate 11 and the other end of the second side plate 12 form open end edges 111 and 121 respectively.

12 Claims, 9 Drawing Sheets

LEAD TERMINAL, RESONATOR AND TRAIN OF ELECTRONIC COMPONENTS

BACKGROUND OF THE INVENTION

The present invention relates to a lead terminal for electronic component, and a ceramic resonator and a train of electronic components using the lead terminals.

With the tendency to pursuit of reduction in size, increase in grade and increase in number of functions of electronic appliances, miniaturization of electronic components used in the electronic appliances has been advanced and accuracy of the order of tens of microns has been demanded as accuracy of assembling position in an assembling process. This demand is applied to assembling of lead terminals of an electronic component without exception. Particularly in the case of lead terminals having a structure in which end edges of an electronic component device shaped like a board are inserted into U-grooves of the terminals so that opposite ends of the electronic component device are held by the terminals, high accuracy of position in attachment of the terminals in depthwise directions of the U-grooves can be obtained because of the structure of the terminals, but accuracy of position in attachment of the terminals in lengthwise directions of the U-grooves is apt to vary according to divergence in positional adjustment of an inserting machine, positional displacement of the terminals, or the like.

For example, a ceramic resonator disclosed in Patent Document 1 is an example of this type electronic component using the terminals. The ceramic resonator has a structure in which first and second vibrating electrodes are formed on opposite surfaces (in a direction of thickness) of a piezoelectric substrate made of a ceramic substance and an electrically insulating resin layer is deposited on each surface (in the direction of thickness) of the piezoelectric substrate so that cavities are formed around the first and second vibrating electrodes respectively to prevent the resin layer from blocking vibration.

Each of the first and second vibrating electrodes has first and second lead electrodes. The respective first and second electrodes of the first and second vibrating electrodes are led out to opposite sides of the piezoelectric substrate laterally. First and second lead wires are attached to the laterally opposite sides of the piezoelectric substrate and connected to the first and second lead electrodes respectively by means of soldering or the like. The whole of the resulting piezoelectric substrate is coated with an external resin. In this manner, a finished product is obtained.

Each of the first and second lead wires has two side plates facing each other with a distance. The side plates are formed so that one end of one side plate is continued to one end of the other side plate while the other end of one side plate and the other end of the other side plate form open end edges. Accordingly, a U-groove is formed between the two side plates of each of the first and second lead wires, so that opposite sides of the piezoelectric substrate can be inserted into the U-grooves respectively. The first and second lead wires between which the piezoelectric substrate is held are positioned while protrusive ends of the open end edges of the two side plates of each lead wire are brought into contact with an outer circumferential surface of the electrically insulating resin layer.

The ceramic resonator, however, has no means for positioning the first and second lead wires in the vertical direction of the piezoelectric substrate corresponding to the lengthwise direction of the U-grooves. For this reason, when positional displacement in the direction of insertion of the piezoelectric substrate is caused by divergence in positional adjustment of a piezoelectric substrate inserting machine, positional displacement of terminals, etc., the displacement may directly result in positional displacement in the vertical direction of the piezoelectric substrate.

The positional displacement has influence on subsequent processes, so that characteristic failure may be generated or variation in characteristic or deterioration of the yield may be caused because the piezoelectric characteristic is suppressed. In addition, positional variation in the vertical direction of the piezoelectric substrate induces coating unevenness in the external resin coating process, so that the amount of the external resin varies in a neighbor of the terminal base of each of the first and second lead wires.

[Patent Document 1] JP-A-2002-13637

SUMMARY OF THE INVENTION

An object of the invention is to provide a lead terminal for electronic component, which can be assembled with high positional accuracy.

Another object of the invention is to provide a ceramic resonator in which positional accuracy in attachment of lead terminals is improved to reduce impedance mismatching.

A further object of the invention is to provide a ceramic resonator in which uneven application of an external resin can be suppressed to attain improvement in strength of terminals.

A still further object of the invention is to provide a train of electronic components having high positional accuracy in attachment of terminals without addition of any special process.

According to first aspect of the present invention, a lead terminal for electronic component includes a lead portion, a first side plate, and a second side plate. The lead portion is made of a rod-like metal conductor and has a step portion at its end portion. The first and second side plates are thinned portions obtained by reducing the thickness of the end portion of the lead portion and are formed so as to be integrated with each other through the step portion. The first and second side plates face each other with a distance. One end of the first side plate and one end of the second side plate are continued to each other while the other end of the first side plate and the other end of the second side plate form open end edges.

In the lead terminal for electronic component, the first side plate and the second side plate face each other with a distance so that one end of the first side plate and one end of the second side plate are continued to each other while the other end of the first side plate and the other end of the second side plate form open end edges. A U-groove is formed as a gap between the first and second side plates. Accordingly, an edge side of an electronic component device shaped like a board can be inserted into the U-groove from the open end edges, so that the edge side of the electronic component device can be clamped between the first and second side plates.

The lead portion has a step portion at its end portion. The first and second side plates are thinned portions obtained by reducing the thickness of the end portion of the lead portion. With this configuration, an end of an edge side of an electronic component device can be made to abut on the step portion under the condition that the edge side of the electronic component device is clamped between the first and second side plates. Accordingly, a relative positional relation between the electrode component device and the lead terminal is decided so that positional variation in attachment of the electrode component device can be prevented.

Although a metal conductor shaped like a square rod or a flat plate may be used as the lead portion, it is preferable that a metal conductor shaped like a round rod is used as the lead portion. Since the round rod-like metal conductor has no directional property in a radial direction, it is unnecessary to adjust the direction in the process for forming the first and second side plates integrally through the step portion. In addition, there is an advantage that a step surface of the step portion obtained is large.

According to second aspect of the invention, a ceramic resonator includes a piezoelectric resonator, a first lead terminal, a second lead terminal, and a resin layer. The piezoelectric resonator has: a piezoelectric substrate made of a ceramic substance; and a first vibrating electrode and a second vibrating electrode formed on opposite surfaces (in a direction of thickness) of the piezoelectric substrate so as to face each other.

Each of the first and second lead terminals is provided as a lead terminal according to the first aspect of the invention. The first lead terminal is provided on a first edge side (in a horizontal direction) of the piezoelectric substrate so as to be electrically connected to the first vibrating electrode. The piezoelectric substrate is clamped between the first and second side plates of the first lead terminal, while the step portion of the first lead terminal abuts on a third edge side of the piezoelectric substrate adjacent to the first edge side.

The second lead terminal is provided on a second edge side of the piezoelectric substrate opposite to the first edge side, so that the second lead terminal is electrically connected to the second vibrating electrode. The piezoelectric substrate is clamped between the first and second side plates of the second lead terminal, while the step portion of the second lead terminal abuts on the third edge side adjacent to the second edge side.

The resin layer is formed so that the piezoelectric substrate and the respective first and second side plates and step portions of the first and second lead terminals are covered with the resin layer while cavities are formed around the first and second vibrating electrodes respectively.

Accordingly, the first and second lead terminals can be attached to the piezoelectric substrate wit high positional accuracy. Hence, vibration failure caused by positional displacement in attachment of the first and second terminals can be prevented, so that impedance mismatching caused by suppression of piezoelectric characteristic can be reduced. In addition, when positional accuracy in attachment of the lead terminals is high, uneven application of an external resin can be suppressed to thereby attain improvement in strength of the terminals.

According to third aspect of the invention, a train of electronic components includes a plurality of electronic components, and a carrier tape. Each of the electronic components is provided as a ceramic resonator according to second aspect of the invention. Lead terminals of the electronic components are held in the carrier tape and arranged at intervals of a predetermined pitch in a lengthwise direction of the carrier tape.

Accordingly, the invention can provide a train of electronic components having high positional accuracy in attachment of terminals.

As described above, the invention can obtain the-following effects.

It is possible to provide a lead terminal for electronic component, which can be assembled with high positional accuracy.

It is possible to provide a ceramic resonator in which positional accuracy in attachment of lead terminals can be improved to thereby reduce impedance mismatching.

It is possible to provide a ceramic resonator in which uneven application of an external resin can be suppressed to attain improvement in strength of terminals.

It is possible to provide a train of electronic components having high positional accuracy in attachment of terminals without addition of any special process.

DETAILED DESCRIPTION OF THE DRAWINGS

1. Lead Terminal for Electronic Component

Figure 1:
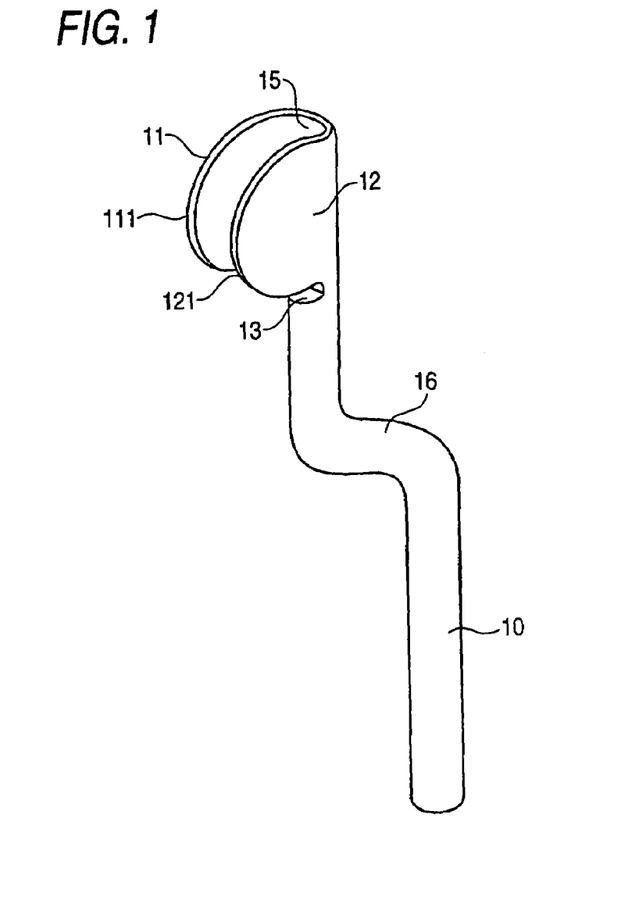
FIG. 1 is a perspective view showing a lead terminal for electronic component according to an embodiment of the invention.
Figure 2:
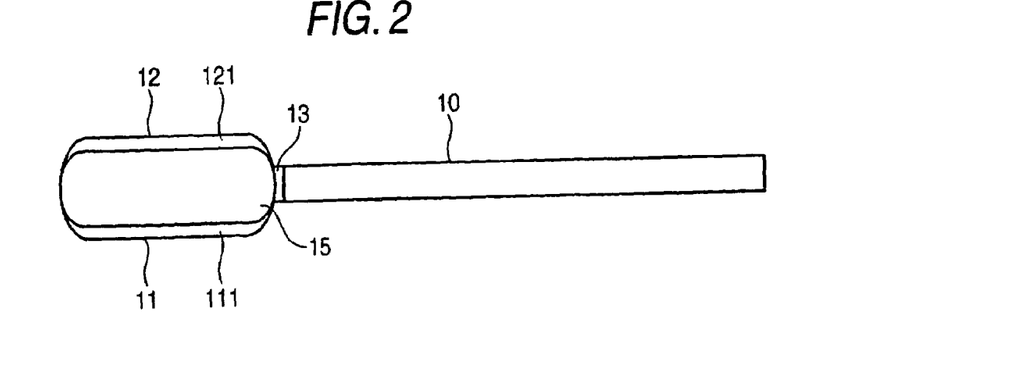
FIG. 2 a front view showing the lead terminal depicted in FIG. 1.
Figure 3:
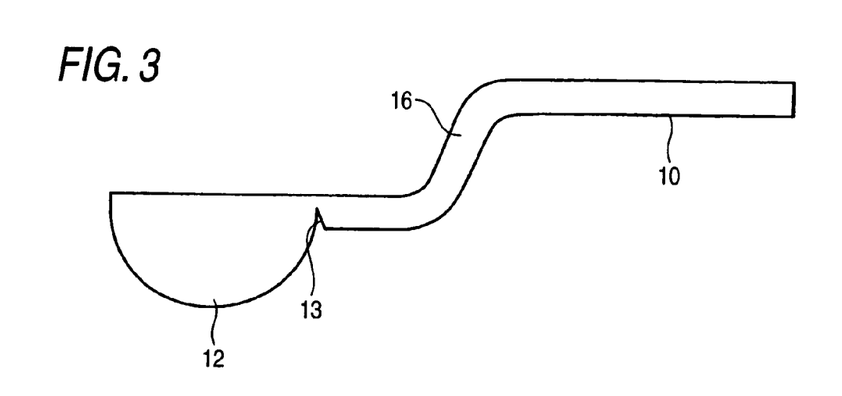
FIG. 3 a side view showing the lead terminal depicted in FIG. 1.
Figure 4:
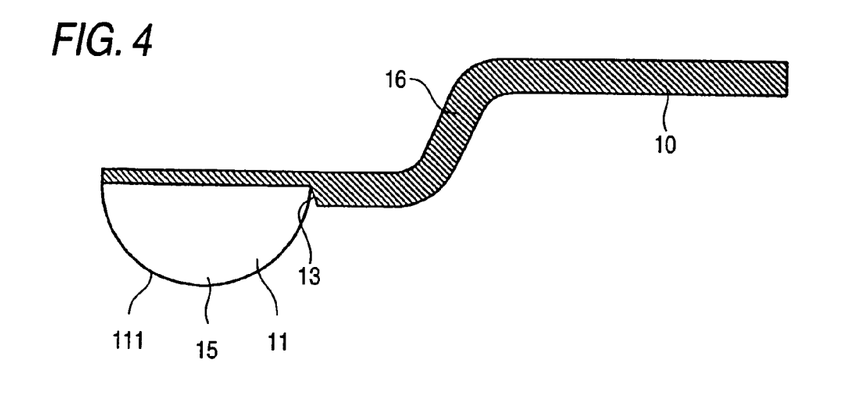
FIG. 4 is a sectional view showing a central portion of the lead terminal depicted in FIG. 1.
Figure 5:
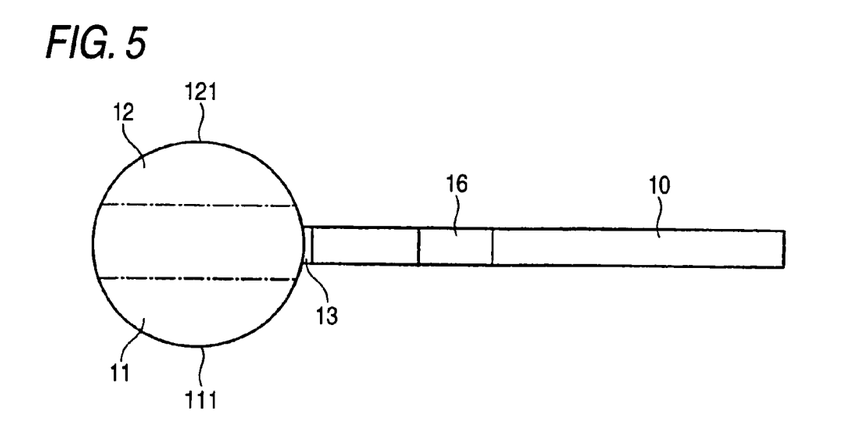
FIG. 5 is a plan view showing the state in which side plates of the lead terminal depicted in FIGS. 1 to 4 are expanded.

FIG. 1 is a perspective view showing a lead terminal for electronic component according to an embodiment of the invention. FIG. 2 is a front view showing the lead terminal depicted in FIG. 1. FIG. 3 is a side view showing the lead terminal depicted in FIG. 1. FIG. 4 is a sectional view showing a central portion of the lead terminal depicted in FIG. 1. FIG. 5 is a plan view showing the state in which side plates of the lead terminal depicted in FIGS. 1 to 4 are expanded (opened).

The lead terminal shown in FIGS. 1 to 5 includes a lead portion 10, a first side plate 11, and a second side plate 12.

The lead portion 10 is made of a metal conductor shaped like a round rod. The lead portion 10 has a step portion 13 formed in such a manner that an end portion of the lead portion 10 is pressed. The first side plate 11 and the second side plate 12 are thinned portions formed in such a manner that the end portion is pressed to reduce its thickness. The first side plate 11 and the second side plate 12 are formed integrally in front of the step portion 13 while facing each other with a distance. One end of the first side plate 11 and one end of the second side plate 12 are continued to each other while the other end of the first side plate 11 and the other end of the second side plate 12 form open end edges 111 and 121. U-groove 15 is formed as a gap between the first side plate 11 and the second side plate 12. The lead terminal according to the embodiment has a portion 16 bent like a crank. This portion 16 functions as a positioning portion when the lead terminal is inserted into a circuit board, etc.

Specifically, the lead terminal is made of a copper wire, etc. having a diameter of about 0.5 mm and a length equal to the total length of the lead terminal. The copper wire is subjected to treatment such as pressing so that one end of the copper wire becomes about 0.2 mm thick. In this manner, the first side plate 11 and the second side plate 12 each having a thickness of about 0.2 mm relative to the lead portion 10 having a diameter of about 0.5 mm are formed together with the step portion 13 having a size of about 0.3 mm.

Each of the first side plate 11 and the second side plate 12 is bent like a circular arc in a process carried out simultaneously with pressing or after pressing, so that the first and second side plates 11 and 12 face each other with a distance. Molding using a mold may be used in place of pressing. Incidentally, pressing has an advantage that the lead terminal can be produced inexpensively.

Figure 6:
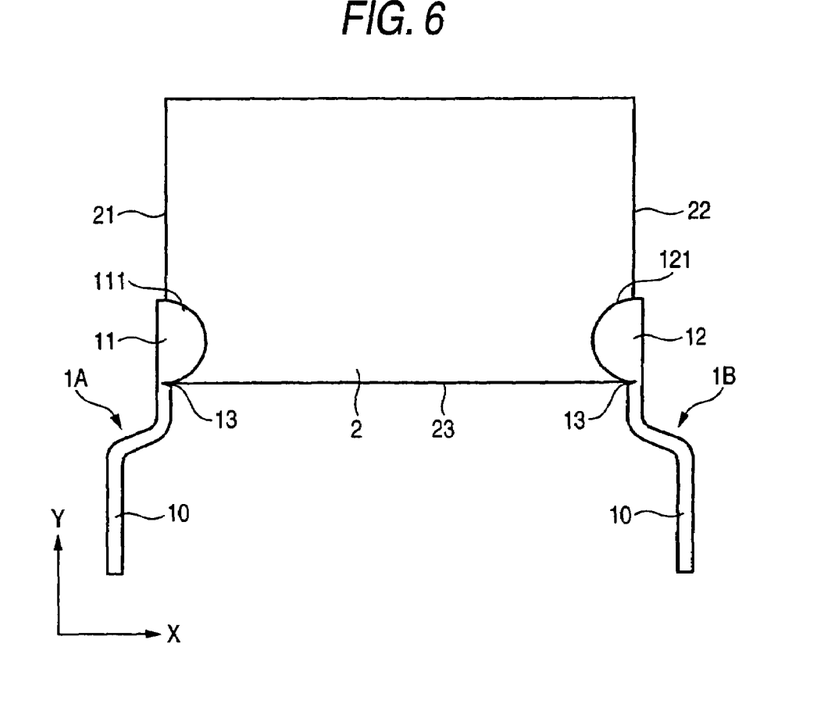
FIG. 6 is a front view showing the state in which lead terminals depicted in FIG. 1 are attached to an electronic component device.
Figure 7:
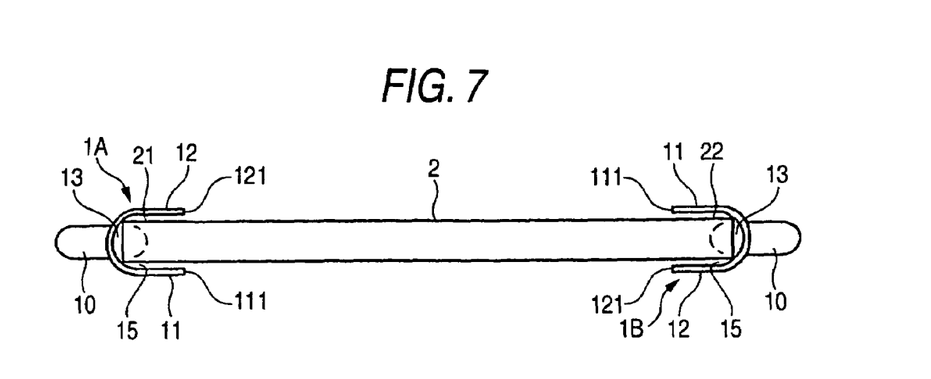
FIG. 7 is a plan view showing the state of the attachment depicted in FIG. 6.

FIG. 6 is a front view showing the state in which lead terminals depicted in FIG. 1 and according to the embodiment are attached to an electronic component device shaped like a rectangular board. FIG. 7 is a plan view showing the attachment state depicted in FIG. 6.

In the embodiment, a first lead terminal 1A and a second lead terminal 1B having the same configuration as the first lead terminal 1A are provided. A first side plate 11 and a second side plate 12 in each of the first and second lead terminals 1A and 1B are formed so as to face each other with a distance so that one end of the first side plate 11 and one end of the second side plate 12 are continued to each other while the other end of the first side plate 11 and the other end of the second side plate 12 form open end edges 111 and 121. A U-groove 15 is formed as a gap between the first and second side plates 11 and 12 of each lead terminal. Accordingly, edge sides 21 and 22 of an electronic component device 2 can be inserted into the U-grooves 15 respectively from the open end edges 111 and 121, so that the edge sides 21 and 22 of the electronic component device can be held between the lead terminals 1A and 1B on opposite sides of the electronic component device.

In each lead terminal, the step portion 13 is formed between the first side plate 11 and the second side plate 12 so as to be integrated with the first and second side plates 11 and 12. Accordingly, the step portion 13 can be made to abut on a third edge side 23 of the electronic component device 2 adjacent to the edge sides 21 and 22. In this manner, the positions of the two lead terminals 1 (1A and 1B) relative to the electronic component device 2 are decided, so that positional variation in attachment of the two lead terminals 1 to the electronic component device 2 can be prevented.

In each of the first and second lead terminals 1A and 1B, the lead portion 10 may be made of a metal conductor shaped like a square rod or a flat plate, but it is preferable that the lead portion 10 is made of a metal conductor shaped like a round rod. Since the round rod-like metal conductor has no directional property in a radial direction, it is unnecessary to adjust the direction in the process for forming the first and second side plates 11 and 12. In addition, there is an advantage that a step surface of the step portion 13 is large. The first and second side plates 11 and 12 may be bent acceptably as long as the step portion 13 is located on a surface where the first and second side plates 11 and 12 face each other. Each of the first and second side plates 11 and 12 bent thus may be shaped like an rectangular portion. When each of the first and second side plates 11 and 12 bent thus is shaped like a circular arc, it is possible to enlarge the range adaptable for the thickness of the edge side of the electronic component device 2 to be inserted between the first and second side plates 11 and 12.

2. Ceramic Resonator

Figure 8:
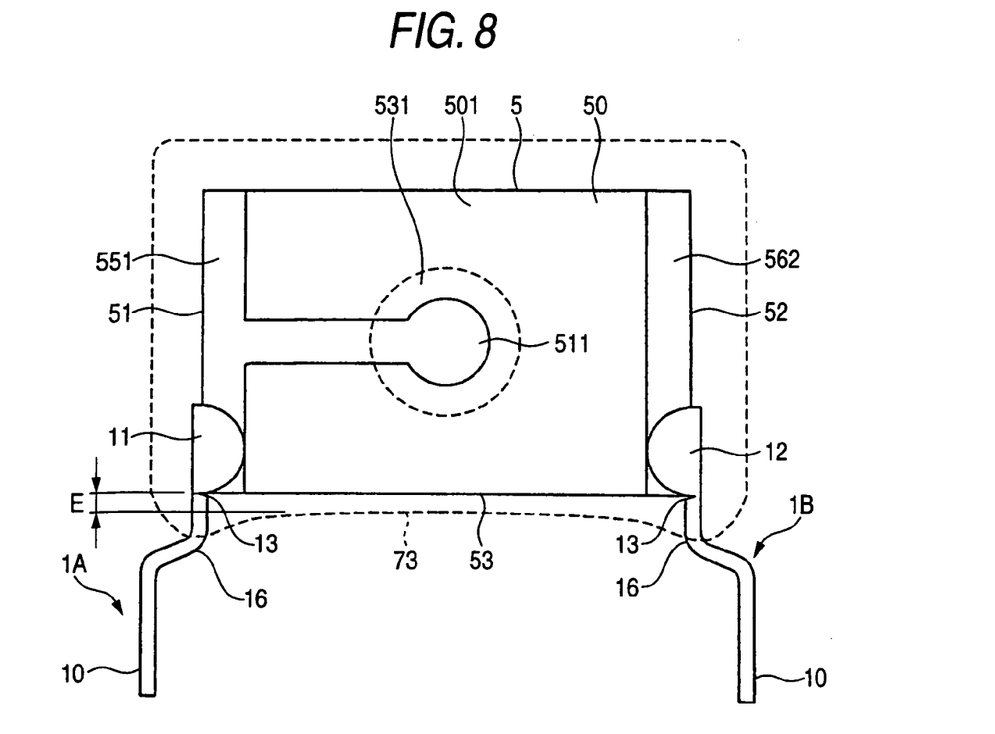
FIG. 8 is a partially cutaway front view of a ceramic resonator according to an embodiment of the invention.
Figure 9:
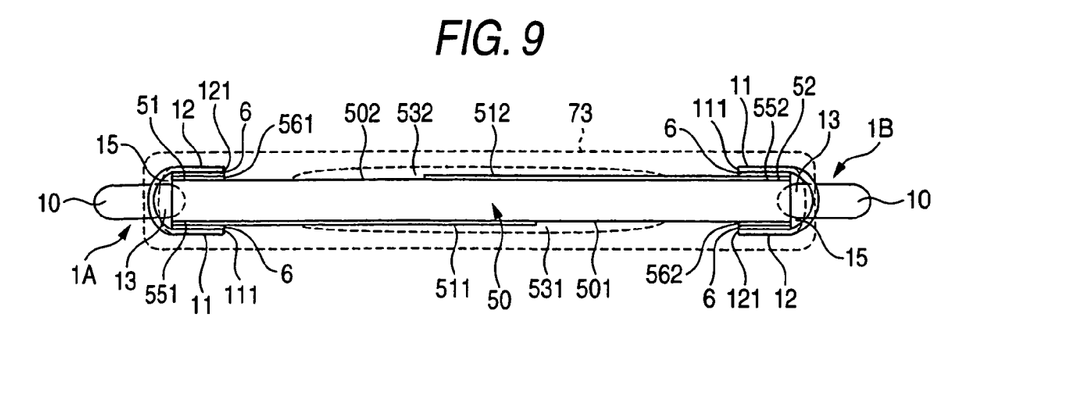
FIG. 9 is a partially cutaway plan view showing the state of the ceramic resonator according to the embodiment after attachment of the lead terminals.

FIG. 8 is a partially cutaway front view of a ceramic resonator according to an embodiment of the invention. FIG. 9 is a partially cutaway plan view of the ceramic resonator depicted in FIG. 8.

The ceramic resonator shown in FIGS. 8 and 9 includes a piezoelectric resonator 5, a resin layer 73, a first lead terminal 1A, and a second lead terminal 1B. The piezoelectric resonator 5 has: a piezoelectric substrate 50 made of a ceramic substance; and a first vibrating electrode 511 and a second vibrating electrode 512 formed on opposite surfaces (in a direction of thickness) of the piezoelectric substrate 50 so as to face each other. By use of the first vibrating electrode 511 and the second vibrating electrode 512, the piezoelectric resonator 5 operates in a vertical vibration mode in the direction of thickness.

The piezoelectric resonator 5 further has a first lead electrode 551, and a second lead electrode 552. The first lead electrode 551 is provided on a first surface 501 of the piezoelectric substrate 50 so as to be electrically connected to the first vibrating electrode 511 provided on the first surface 501. The first lead electrode 551 is led out to a first edge side 51 of the piezoelectric substrate 50.

The second lead electrode 552 is provided on a second surface 502 of the piezoelectric substrate 50 so as to be electrically connected to the second vibrating electrode 512 provided on the second surface 502. The second lead electrode 552 is led out to a second edge side 52 of the piezoelectric substrate 50.

The resin layer 73 is deposited on the piezoelectric substrate 50 so that the opposite surfaces of the piezoelectric substrate 50 in the direction of thickness and their neighbors are covered with the resin layer 73 while first and second cavities 531 and 532 are formed around the first and second vibrating electrodes 511 and 512 respectively.

Each of the first and second lead terminals 1A and 1B has the same configuration as that of the lead terminal shown in FIGS. 1 to 5. Each of the first and second lead terminals 1A and 1B includes a lead portion 10, a first side plate 11, and a second side plate 12.

The lead portion 10 includes a step portion 13 at its end portion. The first side plate 11 and the second side plate 12 are formed so as to face each other with a distance. One end of the first side plate 11 and one end of the second side plate 12 are continued to each other while the other end of the first side plate 11 and the other end of the second side plate 12 form open end edges 111 and 121. The first and second side plates 11 and 12 are formed to be thinner than the lead portion 410 and integrated with the lead portion 10 through the step portion 13.

The first lead terminal 1A is attached to the first edge side 51 in a horizontal direction X of the piezoelectric substrate 50. In the first lead terminal 1A, the first side plate 11 and the second side plate 12 are formed so as to face each other with a distance. One end of the first side plate 11 and one end of the second side plate 12 are continued to the lead portion 10 while the other end of the first side plate 11 and the other end of the second side plate 12 form open end edges 111 and 121. A U-groove 15 is formed as a gap between the first and second side plates 11 and 12. Accordingly, when the first edge side 51 of the piezoelectric substrate 50 is inserted into the U-groove 15 from the open end edges 111 and 121, the first edge side 51 of the piezoelectric substrate 50 can be moved and held in the U-groove 15 from a side of the piezoelectric substrate 50. As a result, the position of the first lead terminal 1A relative to the piezoelectric substrate 50 in the horizontal direction X of the piezoelectric substrate 50 can be decided.

In the first lead terminal 1A, the step portion 13 abuts on a corner of an end edge of a third edge side 53 adjacent to the first edge side 51 of the inserted piezoelectric substrate 50. Hence, the position of the first lead terminal 1A relative to the piezoelectric substrate 50 in a vertical direction Y of the piezoelectric substrate 50 can be decided, so that positional variation in attachment of the first lead terminal 1A to the piezoelectric substrate 50 can be prevented.

The first lead terminal 1A is further connected to a first dummy electrode 561 and the first lead electrode 551 by solder 6 so as to be electrically connected to the first vibrating electrode 511.

The second lead terminal 1B is attached to a second edge side 52 opposite to the first edge side 51 of the piezoelectric substrate 50. In the second lead terminal 1B, the first side plate 11 and the second side plate 12 are formed so as to face each other with a distance. One end of the first side plate 11 and one end of the second side plate 12 are continued to each other along an extension line of the lead portion 10 while the other end of the first side plate 11 and the other end of the second side plate 12 form open end edges 111 and 121. A U-groove 15 is formed as a gap between the first side plate 11 and the second side plate 12. Accordingly, when the second edge side 52 of the piezoelectric substrate 50 is inserted into the U-grove 15 from the open end edges 111 and 121, the second edge side 52 of the piezoelectric substrate 50 can be moved and held in the U-groove 15 from a side of the piezoelectric substrate 50. As a result, the position of the second lead terminal 1B relative to the piezoelectric substrate 50 in the horizontal direction X of the piezoelectric substrate 50 can be decided.

In the second lead terminal 1B, the step portion 13 abuts on a corner of the other end of the third edge side 53 adjacent to the second edge side 52 of the inserted piezoelectric substrate 50. Hence, the position of the second lead terminal 1B relative to the piezoelectric substrate 50 in the vertical direction Y of the piezoelectric substrate 50 can be decided, so that positional variation in attachment of the second lead terminal 1B to the piezoelectric substrate 50 can be prevented.

The second lead terminal 1B is further connected to a second dummy electrode 562 and the second lead electrode 552 by solder 6 so as to be electrically connected to the second vibrating electrode 512.

In each of the first and second lead terminals 1A and 1B according to the embodiment, the U-groove 15 is shaped like a circular arc. The thickness of the piezoelectric substrate 50 to be used in the piezoelectric resonator 5 varies according to the target frequency band. When the U-groove 15 is shaped like a circular arc, there is an advantage that it is possible to enlarge the range adaptable for the thickness of the piezoelectric substrate 50.

The resin layer 73 is formed so that the piezoelectric substrate 50 and the first and second side plates 11 and 12 and step portions 13 of the first and second lead terminals 1A and 1B are covered with the resin layer 73. A process for applying the resin layer 73 is carried out after the first and second lead terminals 1A and 1B are attached. Specifically, the process for applying the resin layer 73 is carried out in the condition that piezoelectric resonator 5 is dipped in a resin dip tank with the first and second lead terminals 1A and 1B as reference lines. For this reason, if there is positional displacement in attachment of the first and second lead terminals 1A and 1B, the dipping depth of the piezoelectric resonator 5 varies. As a result, the thickness dimension E (see FIG. 8) of the resin layer 73 in the central portion of the lower end of the piezoelectric substrate 50 in the finished product varies. The variation in dimension E results in variation in the amount of the resin in the base portions of the first and second lead terminals 1A and 1B to thereby give an influence on strength of the respective terminals. If the dimension E is large, the amount of the resin in the base portions becomes large to improve strength of the terminals but the size of the component becomes large against the purpose of reduction in thickness. It is therefore preferable that the variation in dimension E is so narrow that the dimension E can satisfy a predetermined component size range while the strength of the terminals can be kept.

Figure 10:
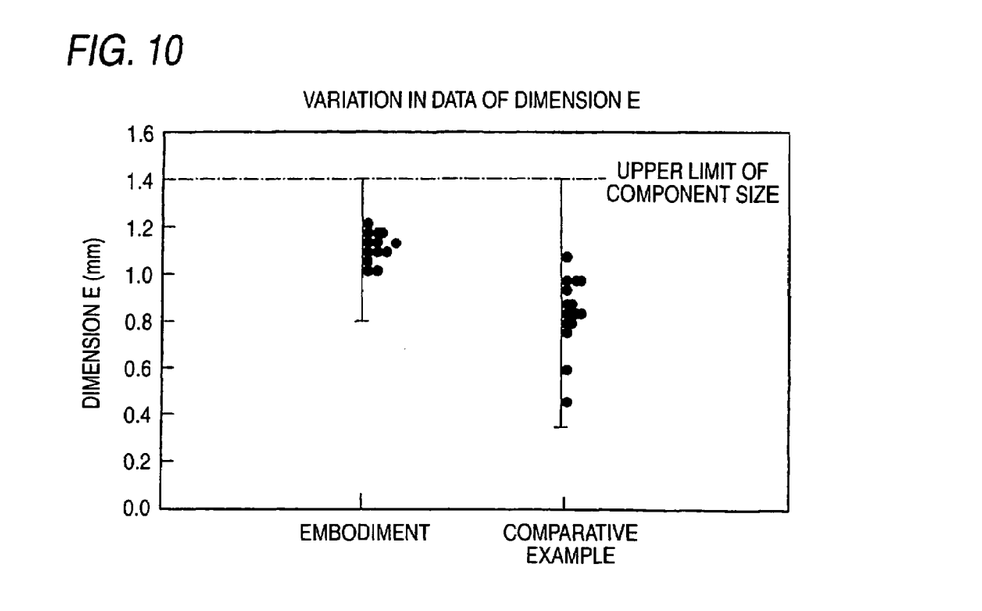
FIG. 10 is a graph showing variation in dimension E.

FIG. 10 is a graph showing variation in dimension E. In the graph, there are shown samples of the ceramic resonator produced according to the embodiment and samples of the ceramic resonator produced according a comparative example of the background art.

As is obvious from FIG. 10, the dimension E in the embodiment varies so narrowly as to be localized on values not larger than the upper limit of the component size. Accordingly, the embodiment is superior to the comparative example in terms of the dimension E.

In the ceramic resonator, the first and second-lead terminals 1A and 1B can be attached to the piezoelectric substrate 50 with high accuracy in the horizontal and vertical directions X and Y of the piezoelectric substrate 50. Accordingly, the piezoelectric resonator 5 operates in a vertical vibration mode in the direction of thickness because there is no influence of vibration failure caused by positional displacement in attachment of the first and second lead terminals 1A and 1B in the first and second cavities 531 and 532 formed in the resin layer 73. Accordingly, impedance mismatching caused by suppression of piezoelectric characteristic can be reduced.

Even in the case where third harmonic resonance is generated in the vertical vibration mode in the thickness direction, the influence of fundamental wave on the third harmonic resonance can be reduced to obtain a ceramic resonator exhibiting little variation in resonance frequency.

Figure 11:
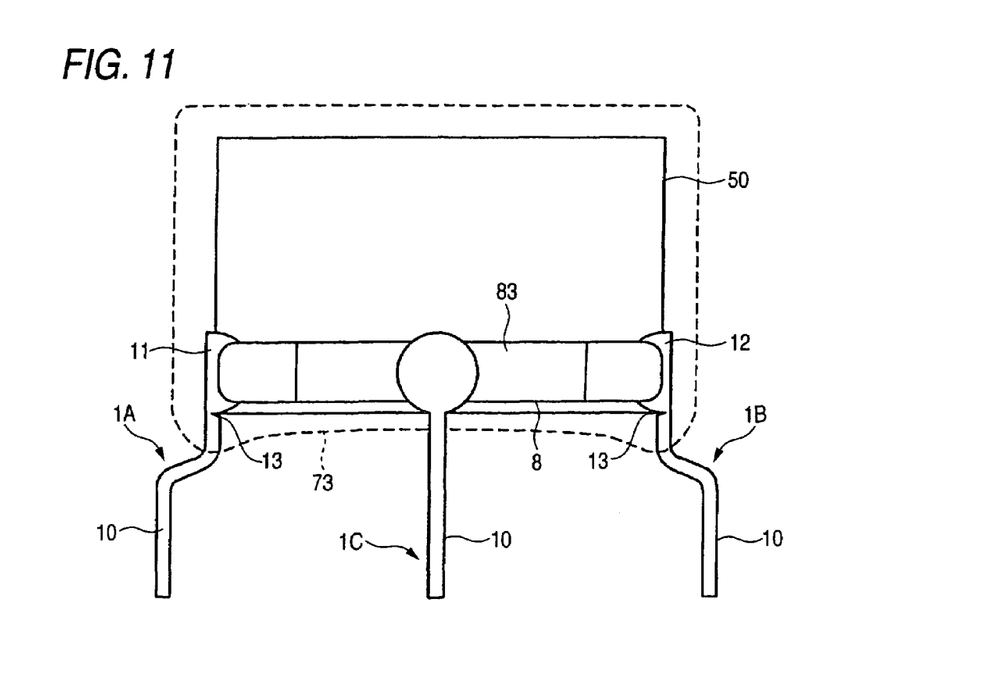
FIG. 11 is a partially cut away front view showing a ceramic resonator according to another embodiment of the invention.
Figure 12:
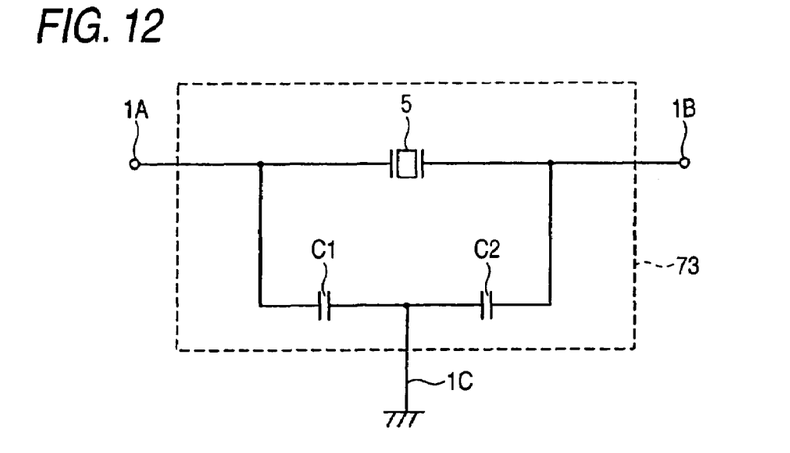
FIG. 12 is a circuit diagram of the ceramic resonator depicted in FIG. 11.
Figure 13:
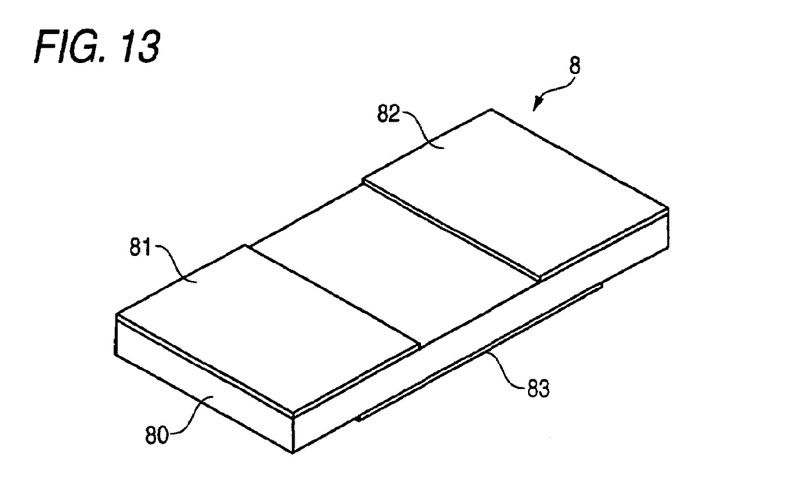
FIG. 13 is a perspective view of a capacitor assembly used in the ceramic resonator depicted in FIG. 11.
Figure 14:
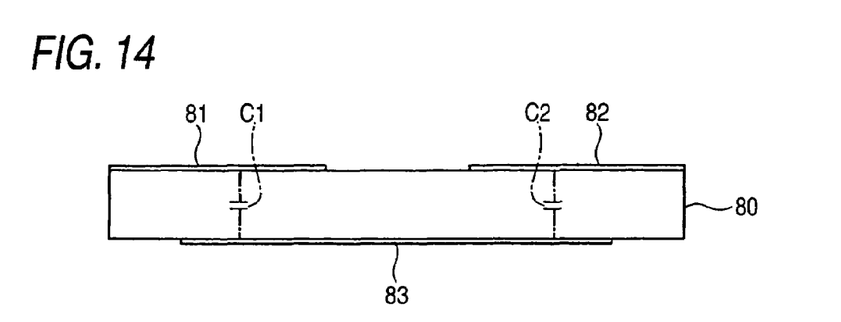
FIG. 14 is a sectional view of the capacitor assembly depicted in FIG. 13.

FIG. 11 is a partially cutaway front view showing a ceramic resonator according to another embodiment of the invention. In FIG. 11, there is shown a capacitor assembly built-in type ceramic resonator. FIG. 12 is a circuit diagram of the ceramic resonator depicted in FIG. 11. FIG. 13 is a perspective view of the capacitor assembly used in the ceramic resonator depicted in FIG. 11. FIG. 14 is a sectional view of the capacitor assembly depicted in FIG. 13.

The ceramic resonator shown in FIG. 11 has a piezoelectric resonator 5, a resin layer 73, a first lead terminal 1A, a second lead terminal 1B, a third lead terminal 1C, and a capacitor assembly 8. The piezoelectric resonator 5, the resin layer 73 and the first and second lead terminals 1A and 1B are configured in the same manner as those in the ceramic resonator shown FIGS. 8 and 9. The duplicated description of these constituent members will be omitted.

The capacitor assembly 8 is formed as a single plate including two capacitors C1 and C2. The capacitor assembly 8 has a single dielectric layer 80, a ground electrode 83, and first and second counter electrodes 81 and 82. The dielectric layer 80 is shaped like a rectangle. The ground electrode 83 is formed on the nearly whole area of one surface of the dielectric layer 80. The first and second counter electrodes 81 and 82 are formed on the other surface of the dielectric layer 80. The lengthwise dimension of the dielectric layer 80 is formed to be equal to the size of the piezoelectric substrate 50 in the horizontal direction X.

In the condition that the first counter electrode 81 abuts on the first side plate 11 of the first lead terminal 1A, the first counter electrode 81 is connected to the first side plate 11 by solder 6. In the condition that the second counter electrode 82 abuts on the second side plate 12 of the second lead terminal 1B, the second counter electrode 82 is connected to the second side plate 12 by solder 6. In this manner, the capacitor assembly 8 is attached to the piezoelectric substrate 50.

The third lead terminal 1C is soldered to the ground electrode 83 of the capacitor assembly 8. The resin layer is formed so that the whole of the piezoelectric substrate 50 including the capacitor assembly 8 is covered with the resin layer 73 while the lead portions 10 of the first, second and third lead terminals 1A, 1B and 1C are led out to the outside of the resin layer 73. The capacitor assembly built-in type ceramic resonator according to the embodiment serves as a three-terminal type ceramic resonator as shown in the circuit diagram of FIG. 12.

In the ceramic resonator, the step portions 13 of the first and second lead terminals 1A and 1B abut on opposite ends of an edge side of the piezoelectric substrate 50 respectively, so that the first and second lead terminals 1A and 1B are positioned. The first and second side plates 11 and 12 of the first and second lead terminals 1A and 1B are located in the lower portion of the piezoelectric substrate 50. The capacitor assembly 8 is also located in the lower portion of the piezoelectric substrate 50. With this configuration, even in the ceramic resonator reduced in thickness, there is no barrier to vibration of first and second vibrating electrodes 511 and 512 located in the central portion of the piezoelectric substrate 50. Accordingly, there is no vibration failure in the piezoelectric resonator 5.

For soldering the first and second counter electrodes 81 and 82 of the capacitor assembly 8, a solder applying process and a soldering process may be carried out simultaneously when the first to third lead terminals 1A to 1C are attached to the piezoelectric substrate 50, so that the processes can be simplified.

3. Train of Electronic Components

Figure 15:
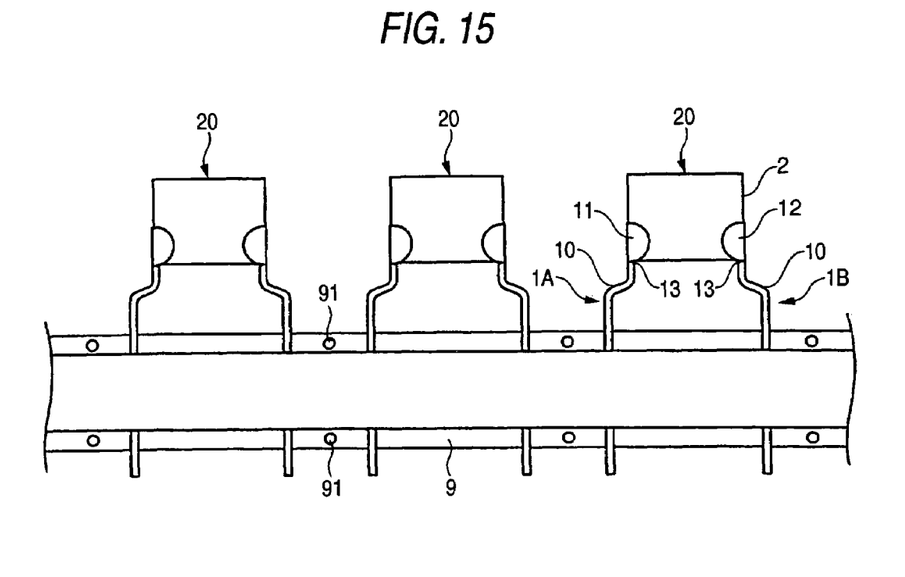
FIG. 15 is a partial front view showing a train of electronic components according to an embodiment of the invention.
Figure 16:
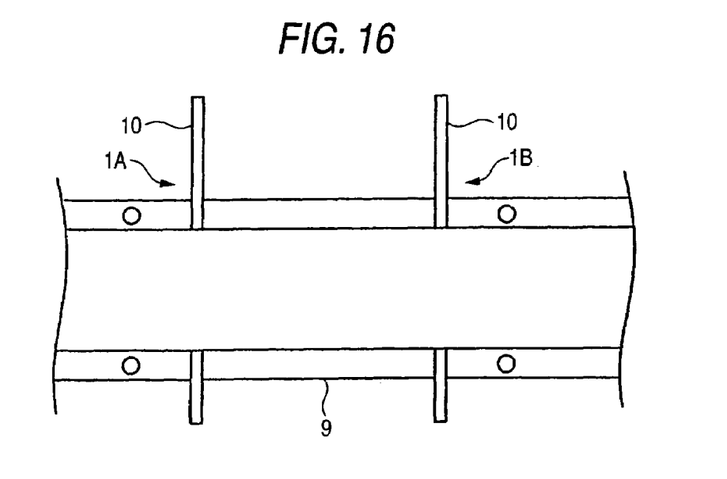
FIG. 16 is a view showing a process of manufacturing the train of electronic components depicted in FIG. 15.

FIG. 15 is a partial front view showing a train of electronic components according to an embodiment of the invention. FIG. 16 is a view showing a process for manufacturing the train of electronic components depicted in FIG. 15.

The train of electronic components shown in FIG. 15 includes a plurality of electronic components 20, and a carrier tape 9. Each of the electronic components 20 includes a rectangular electronic component device 2 such as a ceramic resonator, and first and second lead terminals 1A and 1B paired with each other. The carrier tape 9 is composed of two sheets, that is, a front sheet and a rear sheet. The first and second lead terminals 1A and 1B are held between the front and rear sheets of the carrier tape 9. The reference numeral 91 designates holes for carrying the tape.

The first and second lead terminals 1A and 1B in the plurality of electronic components 20 are held between the sheets of the carrier tape 9 and arranged at intervals of a predetermined pitch in the lengthwise direction of the carrier tape 9. The first and second lead terminals 1A and 1B are configured in the same manner as in FIGS. 1 to 4.

The train of electronic components is produced by the process shown in FIG. 16. First, as shown in FIG. 16, rod-like metal conductors which serve as the first and second lead terminals 1A and 1B are cut into a predetermined size and arranged at intervals of a predetermined pitch and held in the carrier tape 9.

Figure 17:
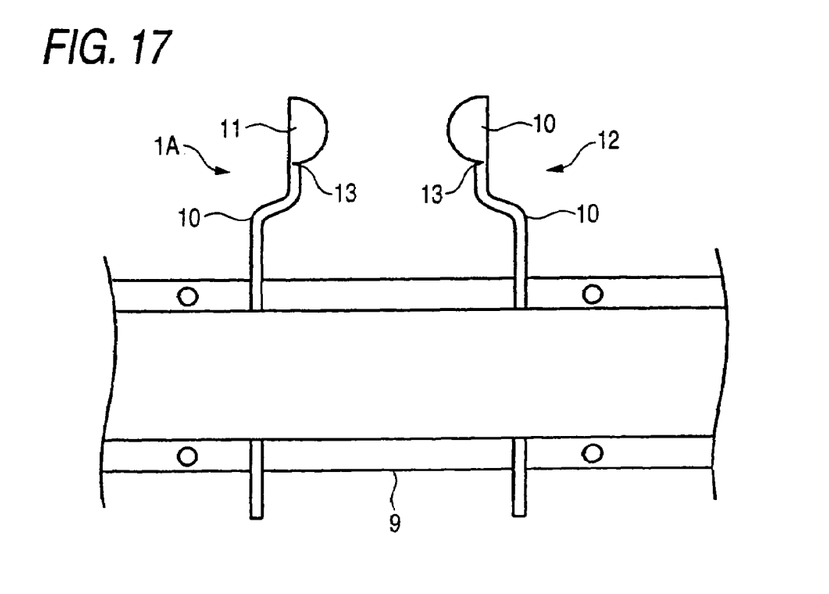
FIG. 17 is a view showing a manufacturing process after the manufacturing process shown in FIG. 16.

Next, as shown in FIG. 17, pressing is applied to the rod-like metal conductors 16 to form first and second side plates 11 and 12 and a step portion 13. The first and second lead terminals 1A and 1B similar to those shown in FIGS. 1 to 4 are held in the carrier tape 9.

Figure 18:
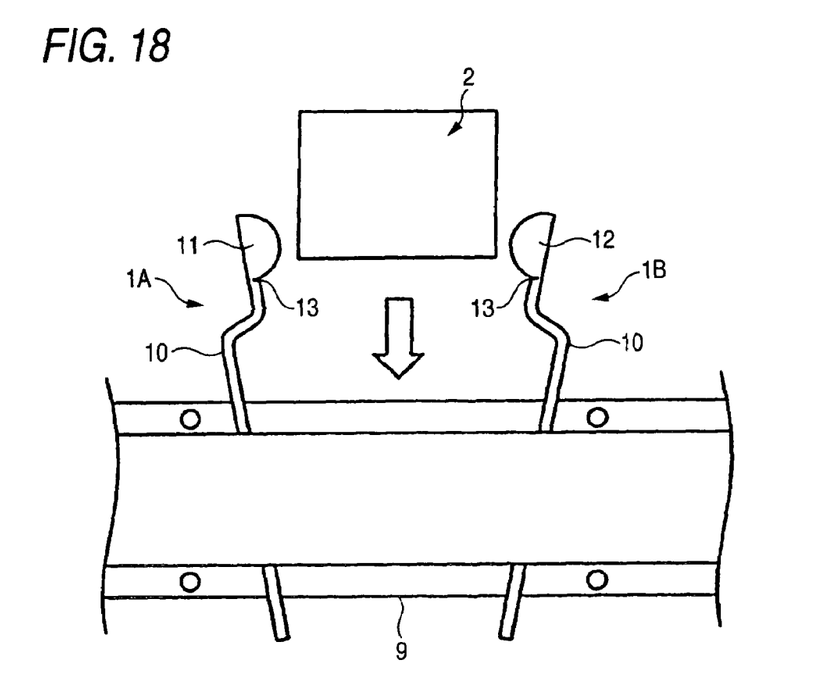
FIG. 18 is a view showing a manufacturing process after the manufacturing process shown in FIG. 17.

Next, as shown in FIG. 18, the gap between the first lead terminals 1A and 1B opposite to each other and held in the carrier tape 9 is enlarged so that an electronic component device 2 is moved into the gap.

Figure 19:
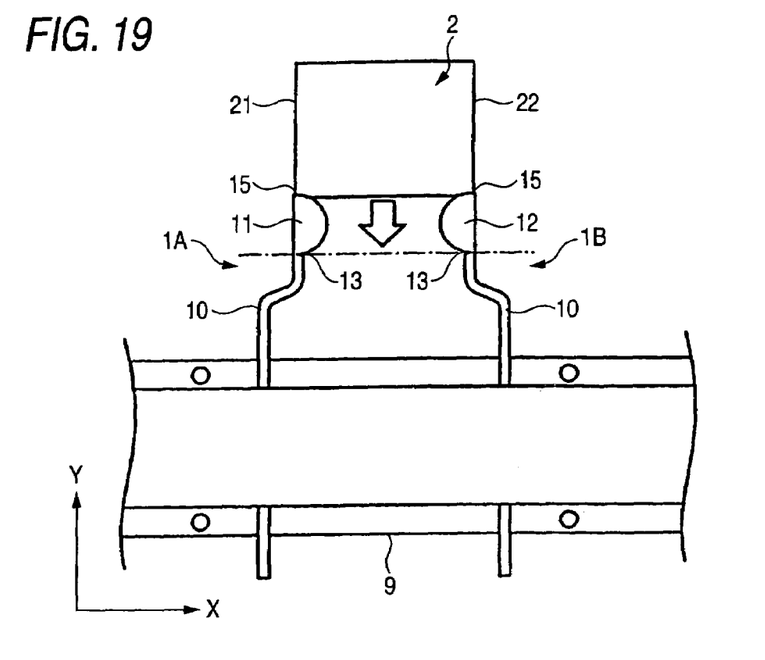
FIG. 19 is a view showing a manufacturing process after the manufacturing process shown in FIG. 18.

Next, as shown in FIG. 19, the first and second lead terminals 1A and 1B are closed to each other. End edge sides 21 and 22 of the electronic component device 2 are inserted into the U-grooves 15 formed as gaps between the first and second side plates 11 and 12 of the first and second lead terminals 1A and 1B so that the end edge sides 21 and 22 are held from opposite sides of the electronic component device 2. The electronic component device 2 is positioned in a horizontal direction X of the electronic component device 2 by the structure of the first and second lead terminals 1A and 1B. Further, the electronic component device 2 is pushed down in a vertical direction Y so as to abut on the step portions 13.

Figure 20:
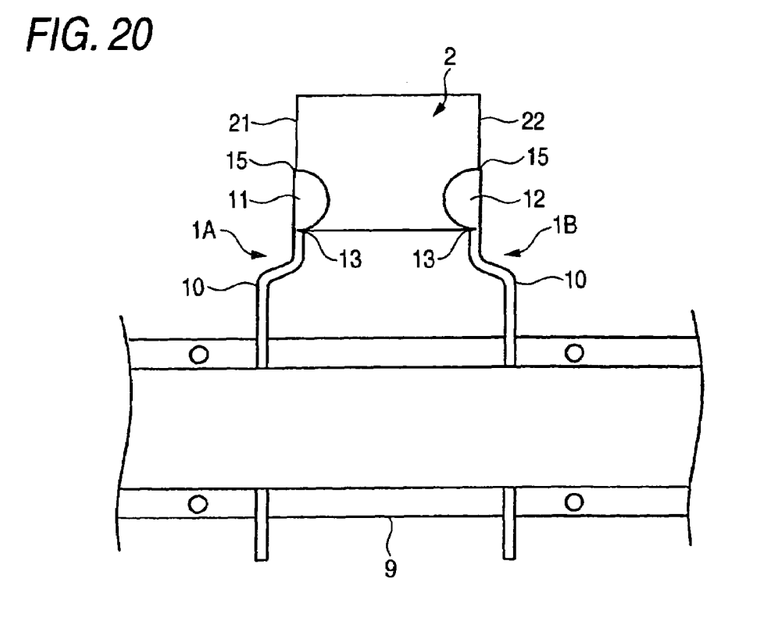
FIG. 20 is a view showing a manufacturing process after the manufacturing process shown in FIG. 19.

Next, as shown in FIG. 20, when ends of the edge sides 21 and 22 of the electronic component device 2 abut on the step portions 13, the positions of the first and second lead terminals 1A and 1B relative to the electronic component device 2 are decided. Accordingly, the first and second lead terminals 1A and 1B can be attached to the electronic component device 2 with high positional accuracy. Electronic component devices 2 each having the first and second lead terminals 1A and 1B attached thereto form a train of electronic components after subsequent processes.

In this manner, the train of electronic components can be formed easily without addition of any special process. It is possible to obtain a train of electronic components having high positional accuracy in attachment of the first and second lead terminals 1A and 1B to each electronic component device 2.

Though not shown, ceramic resonators as shown in FIGS. 11 and 12 may be used as members for forming the train of electronic components.

The invention has been described above in detail in conjunction with the preferred embodiments. The invention is however not limited to these preferred embodiments. It is self-evident that those skilled in the art can conceive various modifications on the basis of the fundamental technical thought and suggestion of the invention.

What is claimed is:

1. A lead terminal for electronic component comprising:
a lead portion made of a metal conductor and having a step portion and a thinned end portion; and
first and second side plates provided at said thinned end portion, separated from said step portion, and facing each other with a predetermined distance so that one end of said first side plate and one end of said second side plate are continued to each other through said thinned end portion while the other end of the first side plate and the other end of the second side plate form open end edges respectively.

2. A lead terminal for electronic component according to claim 1, wherein said lead portion is made of a round rod-like metal conductor while said step portion and said thinned portions are formed by pressing.

3. A lead terminal for electronic component according to claim 1, wherein said thinned end portion, said first side plate and said second side plate have a same thickness.

4. A lead terminal for electronic component according to claim 1, wherein the first and second side plates and the thinned end portion constitute a circular arc shape.

5. A ceramic resonator comprising:
a piezoelectric resonator including a piezoelectric substrate made of a ceramic substance, and a first vibrating electrode and a second vibrating electrode formed on opposite surfaces in a direction of thickness of said piezoelectric substrate so as to face each other;
first and second lead terminals, each comprising a lead portion made of a metal conductor and having a step portion and a thinned end portion, and first and second side plates provided at said thinned end portion, separated from said step portion, and facing each other with a predetermined distance so that one end of said first side plate and one end of said second side plate are continued to each other through said thinned end portion while the other end of the first side plate and the other end of the second side plate form open end edges respectively,
said first lead terminal provided on a first edge side in a horizontal direction of said piezoelectric substrate so as to be electrically connected to said first vibrating electrode in the condition that said piezoelectric substrate is clamped between said first and second side plates of said first lead terminal while said step portion of said first lead terminal abuts on a third edge side adjacent to said first edge side;
said second lead terminal provided on a second edge side of said piezoelectric substrate opposite to said first edge side so as to be electrically connected to said second vibrating electrode in the condition that said piezoelectric substrate is clamped between said first and second side plates of said second lead terminal while said step portion of said second lead terminal abuts on said third edge side adjacent to said second edge side; and
a resin layer formed so that said piezoelectric substrate and the respective first and second side plates and step portions of said first and second lead terminals are covered with said resin layer while cavities are formed around said first and second vibrating electrodes respectively.

6. A ceramic resonator according to claim 5, further comprising a capacitor assembly and a third lead terminal, wherein
said capacitor assembly has a dielectric layer, a ground electrode, and first and second electrodes opposite to each other,
said ground electrode is formed on one surface of said dielectric layer,
said first and second electrodes are formed on the other surface of said dielectric layer,
said first and second electrodes abut on said first and second side plates of said first and second lead terminals so as to be electrically connected to said first and second lead terminals respectively; and
said third lead terminal is connected to said ground electrode.

7. A train of electronic components comprising a plurality of electronic components, and a carrier tape, wherein
each of said plurality of electronic components is provided as a ceramic resonator defined in claim 6, and
said lead terminals of said plurality of electronic components are held in said carrier tape and arranged at intervals of a predetermined pitch in a lengthwise direction of said carrier tape.

8. A train of electronic components comprising a plurality of electronic components, and a carrier tape, wherein
each of said plurality of electronic components is provided as a ceramic resonator defined in claim 5, and
said lead terminals of said plurality of electronic components are held in said carrier tape and arranged at intervals of a predetermined pitch in a lengthwise direction of said carrier tape.

9. A ceramic resonator according to claim 5, wherein said thinned end portion, said first side plate and said second side plate have a same thickness.

10. A ceramic resonator according to claim 5, wherein the first and second side plates and the thinned end portion constitute a circular arc shape.

11. A train of electronic components comprising:
a plurality of ceramic resonators; and
a carrier tape,
wherein
each of said plurality of ceramic resonators comprises
a piezoelectric resonator including a piezoelectric substrate made of a ceramic substance, and a first vibrating electrode and a second vibrating electrode formed on opposite surfaces in a direction of thickness of said piezoelectric substrate so as to face each other,
first and second lead terminals, each comprising a lead portion made of a metal conductor and having a step portion at its end portion, and first and second side plates provided as thinned portions at said end portion and formed so as to be integrated with each other, and facing each other with a predetermined distance so that one end of said first side plate and one end of said second side plate are continued to each other while the other end of the first side plate and the other end of the second side plate form open end edges respectively,
said first lead terminal provided on a first edge side in a horizontal direction of said piezoelectric substrate so as to be electrically connected to said first vibrating electrode in the condition that said piezoelectric substrate is clamped between said first and second side plates of said first lead terminal while said step portion of said first lead terminal abuts on a third edge side adjacent to said first edge side, said second lead terminal provided on a second edge side of said piezoelectric substrate opposite to said first edge side so as to be electrically connected to said second vibrating electrode in the condition that said piezoelectric substrate is clamped between said first and second side plates of said second lead terminal while said step portion of said second lead terminal abuts on said third edge side adjacent to said second edge side, and a resin layer formed so that said piezoelectric substrate and the respective first and second side plates and step portions of said first and second lead terminals are covered with said resin layer while cavities are formed around said first and second vibrating electrodes respectively, and said lead terminals are held in said carrier tape and arranged at intervals of a predetermined pitch in a lengthwise direction of said carrier tape.

12. A train of electronic components according to claim 11, wherein the ceramic resonator further comprises a capacitor assembly and a third lead terminal, wherein said capacitor assembly has a dielectric layer, a ground electrode, and first and second electrodes opposite to each other, said ground electrode is formed on one surface of said dielectric layer, said first and second electrodes are formed on the other surface of said dielectric layer, said first and second electrodes abut on said first and second side plates of said first and second lead terminals so as to be electrically connected to said first and second lead terminals respectively, and said third lead terminal is connected to said ground electrode.

* * * * *